United States Patent [19]

Slysh

[11] Patent Number: 5,147,680
[45] Date of Patent: Sep. 15, 1992

[54] LASER ASSISTED MASKING PROCESS

[76] Inventor: Paul Slysh, P.O. Box 711401, San Diego, Calif. 92171

[21] Appl. No.: 612,870

[22] Filed: Nov. 13, 1990

[51] Int. Cl.⁵ .................. B05D 3/06; B05D 5/00; B05D 1/02; B23K 26/00
[52] U.S. Cl. .................. 427/53.1; 427/256; 427/348; 427/378; 427/421; 156/643; 219/121.85; 219/121.76
[58] Field of Search .......... 427/53.1, 271, 256, 427/348, 349, 377, 378, 421; 156/643; 219/121.85, 121.76

[56] References Cited

U.S. PATENT DOCUMENTS

| | | | |
|---|---|---|---|
| H 988,538 | 1/1991 | Horvei et al. | 427/53.1 |
| 4,122,240 | 3/1977 | Banas et al. | 427/53.1 |
| 4,200,669 | 4/1980 | Schaefer et al. | 427/53.1 |
| 4,218,494 | 8/1980 | Belmondo et al. | 427/53.1 |
| 4,258,078 | 3/1981 | Celler et al. | 427/53.1 |
| 4,348,263 | 9/1982 | Draper et al. | 427/53.1 |
| 4,365,135 | 12/1982 | McWilliams | 427/53.1 |
| 4,414,059 | 11/1983 | Blum et al. | 427/53.1 |
| 4,568,409 | 2/1986 | Caplan | 427/53.1 |
| 4,578,281 | 3/1986 | Ebisawa | 427/53.1 |
| 4,644,127 | 2/1987 | La Rocca | 427/53.1 |
| 4,700,198 | 10/1987 | Shirahata | 427/53.1 |
| 4,758,533 | 7/1988 | Magee et al. | 427/53.1 |
| 4,778,693 | 10/1988 | Drozdowicz et al. | 427/53.1 |
| 4,810,525 | 3/1989 | Morita et al. | 427/53.1 |
| 4,814,259 | 3/1989 | Newman et al. | 427/53.1 |
| 4,832,993 | 5/1989 | Coulon | 427/53.1 |
| 4,871,415 | 10/1989 | Park et al. | 427/53.1 |
| 4,877,644 | 10/1989 | Wu et al. | 427/53.1 |
| 4,898,650 | 2/1990 | Wu et al. | 427/53.1 |
| 4,915,981 | 4/1990 | Traskos et al. | 427/53.1 |
| 4,931,424 | 6/1990 | Henty | 427/53.1 |
| 4,962,057 | 10/1990 | Epler et al. | 427/53.1 |

*Primary Examiner*—Marianne Padgett
*Attorney, Agent, or Firm*—Frank D. Gilliam

[57] ABSTRACT

A method of accurately applying maskant to a workpiece using one or more scanned laser beams and a maskant delivery device. The method includes the interaction of the laser beams with the maskant material while the material is in transit to, and after it has reached the surface of, the workpiece. Other features of the method include: laser roughening of application surfaces and laser melting of maskant to enhance adhesion of the maskant, laser measurement of maskant edges and correction of detected edge errors, and suppression of maskant ignition by forced ventilation and inert gas environments.

16 Claims, 1 Drawing Sheet

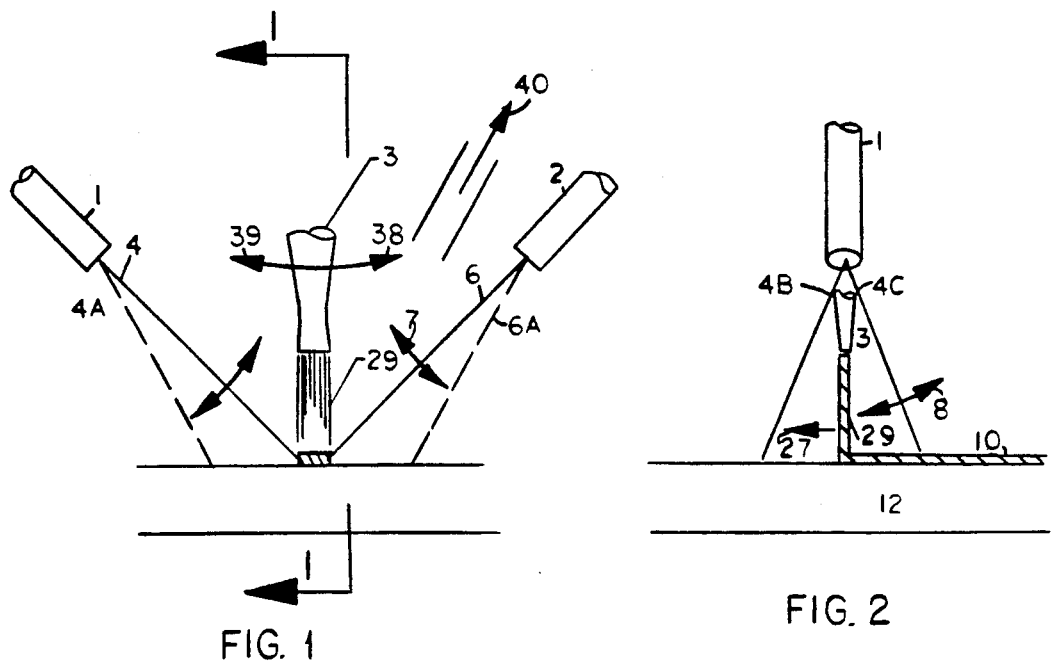
FIG. 1
FIG. 2
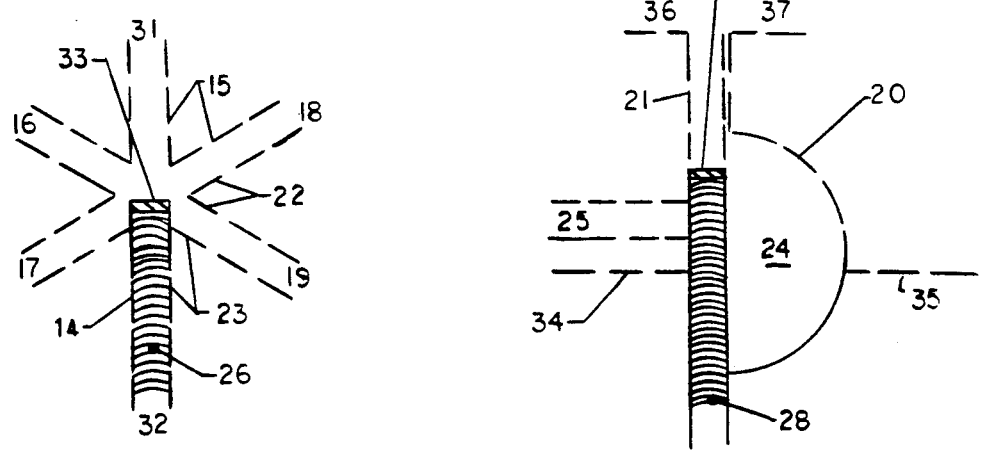
FIG. 3
FIG. 4
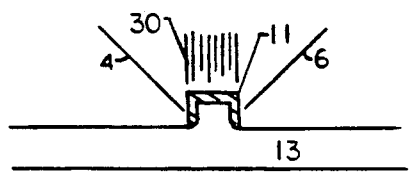
FIG. 5

LASER ASSISTED MASKING PROCESS

BACKGROUND OF THE INVENTION

This invention relates to the general process and means thereof for applying and trimming maskant with the aid of one or more lasers on structural forms or workpieces for the purpose of performing chemical milling on them. One of the purposes of performing chemical milling, but not limited to this purpose, is to produce an integral ribbed stiffened structure such as an isogrid or waffle structure in which bosses and other local features are optionally incorporated into the rib stiffening pattern.

Chemical milling normally comprises the steps of:

(a) preparing the surfaces of the workpiece to be chemically milled by dust or sand blasting the surface and then wiping it with polypropyl alcohol or an equivalent solvent to respectively roughen and clean the surface to thereby promote maskant adhesion, (b) spraying the entire surface of the workpiece with one or more coats of maskant including an optional topcoat, one or both of which are impervious to the etchant bath in which the workpiece is to be immersed, (c) scribing the maskant as with, fixtured and guided, manually operated Exacto knives or a numerically controlled (NC) laser cutter, (d) stripping away the maskant from areas that are to be chemically milled, (e) performing the chemical milling by immersing the workpiece in an etchant vat and creating relative motion between the etchant and the workpiece as by rotationally actuating the workpiece and/or agitating the etchant, (f) removing the maskant when the chemical milling is completed, (g) repeating steps (a) to (f) above for subsequent chemical milling cuts on either all or part of the area previously chemically milled or on areas that were not previously chemically milled.

U.S. Pat. No. 2,739,047 issued Mar. 20, 1956 to M. C. Sans discloses a process and a resultant article in which my invention applies and improves both the process and the resultant article. The processes and products in the Sans patent are representative of, but not limited to, the processes and products to which my invention applies.

An understanding of the background of my invention is further provided by reference to processes and products produced by deep cut chemical milling. Each deep chemical milling cut requires the application of 2 to 3 coats of maskant, as with a hot airless spray gun, followed by curing, drying, scribing and finally peeling away of maskant from those areas to be exposed to the etchant. When a cut is completed, the remaining maskant is stripped away and the part is cleaned and typically dust blasted. This process must be repeated for each successive chemical milling cut. After the first cut, maskant scribing or laser cutting may have to take place on non-flat or irregular surfaces.

In place of applying maskant over an entire part, this invention applies maskant accurately and directly where needed thereby also eliminating the need for scribing or laser cutting and peeling.

This invention includes the use of a robot or a multi axis milling machine type actuator system to transport a maskant applicator and laser head relative to a part on which the maskant is to be applied.

A laser assisted applicator head consists of a maskant spraying, painting or application device plus one or more scanned laser beams. The maskant applicator device can be an airless brush, a hot airless spray nozzle, an air driven spray gun, a roller, an air brush or any applicator or dispenser of maskant. The scanned laser beam or beams, on one or more sides of the maskant applicator device, are fan beam scanned in the direction of the laser and maskant application head movement and are positioned to act on the maskant spray at the instant the spray is airborne and/or impinging on the workpiece surface. The effect of the scanned laser beam is in part to disintegrate the excess maskant that would otherwise adhere to the surface and cause an irregular edge along the strip of maskant applied by the translation of the maskant application device. In addition the scanned laser beam trims and shapes the edges of the maskant at the very instant maskant is applied to the surface and thereby further contributes to the positional and width accuracy of the maskant strip. The same procedure is used for successive maskant coats.

Advantages derived from the use of this invention include, but are not limited to:

1. Quality of resultant products are improved by the high accuracy with which the maskant can be laid and positioned.
2. Material savings, especially in the maskant; approximately 90% of the maskant is saved.
3. Speed of the maskant application is much higher than possible by manual means.
4. Quality is improved by virtue of eliminating all manual operations.
5. Due to uniform feeds and speeds made possible by machine control the maskant thickness can be more accurately controlled than possible by conventional manually controlled application means. (i.e. The estimated maskant thickness may be reduced to 0.005 to 0.008 inch from 0.005 to 0.015 inch.)
6. The second maskant coat, such as the topcoat, can be extended to cover the longitudinal edges of the strip which are ordinarily exposed to the maskant (i.e. with no topcoat) in conventional scribing or laser cutting were these operations are performed after all coating applications are first completed.
7. Ventilation of spray fumes and laser created debris is minimized by virtue of the generation of a large percent of the fumes and debris off the application surface where they are already airborne and easily entrained by ventilating air flows.
8. In place of two or more trimming laser scanners, one laser scanner can be used on one side of the maskant application nozzle to affect trimming on that side of the maskant strip which is made substantially narrower than the space between the impingement points on the application surface of the laser beams. A second parallel maskant strip application is overlapped on this strip and the opposite edge is then trimmed.
9. Risks are eliminated for maskant lifts due to operator errors while stripping the maskant.

BRIEF DESCRIPTION OF THE FIGURES

Further details of the invention, and certain preferred embodiments thereof will be further understood upon reference to the drawing, wherein:

FIG. 1 is a front elevation view of the laser assisted maskant plotting system;

FIG. 2 is a side elevation view of the laser assisted maskant plotting system in FIG. 1;

FIG. 3 is a local view of second cut maskant spraying and edging:

FIG. 4 is a plan view of the maskant pattern at a typical node feature for a ribbed chemically milled structure.

FIG. 5 is a plan view of the maskant and pattern at a typical node feature for a chemically milled structure.

DETAILED DESCRIPTION OF THE INVENTION

FIG. 1 shows a front elevation of the laser assisted maskant application system where laser heads 1 and 2 respectively produce laser fan beams 4 and 6 scanned normal to the plane of FIG. 1 and directed to impinge on the structure 12 along the edges of a maskant strip 10. The strip is produced, shaped and trimmed by the actions of the directed maskant spray stream 29 from the maskant spray nozzle 3, the scanned laser beams and the combined translation of the nozzle 3 and laser heads 1 and 2 in a direction parallel to the length of the maskant strip 10. Additional layers of maskant can be applied over the first strip by repeating these steps a selected number of times.

As needed the orientations of scanned laser fan beams 4 and 6 can be respectively altered in directions 5 and 7 for example to lie in planes 4a and 6a.

Forced air ventilation 40 is provided to exhaust circulating air whose currents are induced by the ventilation. The circulating air currents are directed to entrain and remove maskant volatile products and debris generated by the interaction of the laser beams with the maskant spray and deposited strip. The ventilating air stream may use a hot gas or air stream to heat and dry the maskant as it is being sprayed and/or after it has adhered to the workpiece.

The laser scan angle, scan shape, scan rate, scan orientation, focal point, on-off switching and power intensity are all numerically controlled and programmable.

The nozzle 3 is also optionally scanned and programmable in directions 38 and 39. Robots or multiple axis positioning systems can be used to move and position the laser head and maskant application system.

FIG. 2 a side elevation view of section I—I shown in FIG 1. This figure shows the direction of movement 27 of the combined nozzle 3, ventilation tube and laser heads 1 and 2. The shaped maskant spray 29 is shown at the leading edge of the maskant strip 10 it is producing; the limits 4b and 4c of the scanned laser beam 4 are also shown in the figure. If desired, the laser beam may be directed onto the workpiece area immediately preceding the maskant stream to condition it by scoring or roughening the workpiece surface for enhancing the adhesion of the maskant to the workpiece. The laser beam, at lower energy levels, may be directed against newly applied maskant or the maskant edges to heat the maskant to enhance adhesion to the workpiece.

The maskant spray stream 29 is located in the mid scan area between 4b and 4c of the scanned laser beams 4 and 6. In this position the spray stream 29 experiences maximum containment by the scanned beams 4 and 6. Spurious spray material which comes in contact with the laser beams, before it reaches the workpiece 10, is either vaporized or disintegrated.

The scanned beams 4 and 6 are focused and directed to concentrate their energy along the two lines formed by the intersection of the edges of the strip 10 and the workpiece 12. The focused energy is made sufficient in this invention to either vaporize or disintegrate the maskant material before it lands on the workpiece outside of the laser focused lines. This invention also calls for a selection of a high enough laser scan rate and energy level to insure that no maskant material can penetrate the screen formed by scanning laser beams.

To avoid selected or previously masked areas the laser beams are scanned in a discontinuous pattern as shown by the heavy dash lines in FIG. 3. This figure shows the outline of a typical isogrid node maskant pattern in which maskant strips legs 16, 17, 32, 19, 18 and 31 terminate on the isogrid node. For this illustration, legs 18 and 19 are shown as having previously been applied or created, legs 16 and 17 have not yet been applied and legs 32 and 31 are in the process of being applied with 26 representing the maskant being deposited. The heavy dashed lines 14, 23, 22, and 15 represent the traces of the laser beams on the workpiece. The spray stream 33 is in the mid area of and is surrounded on two sides by the laser beams. In this position spurious material escaping the spray stream are intercepted by the laser beams and inhibited from being deposited on unmasked areas of the workpiece.

In FIG. 3 laser scan traces can be generated by one or more scanned and on-off switched laser beams.

Two or more laser beams can be directed and scanned to cross each other on either side of the maskant strip thereby further contributing to the envelopment of the maskant stream from two to four sides and to further improve the vaporization and disintegration of its emitted spurious material. The focal points of the crossing beams are directed away from workpiece areas on which maskant has already been deposited.

In FIG. 3 the maskant strip 26 being deposited to form legs 32 and 31 is positioned and/or shaped to overlap the ends of strips 18 and 19 which have already been deposited. There is no laser energy directed along the line forming the overlap. The laser beam is shut off wherever it would cross such an overlap to prevent damage to previously applied maskants and other materials which may be on the workpiece.

Laser energy which can ignite volatile maskant vehicles such as trichloroethdene, perchloroethelyne or toluene is controlled in this invention by the expedients of properly controlling laser energy, push and/or pull ventilation including inert gas ventilation and workpiece minimum thickness selected to permit the mass and specific heat properties of the workpiece material to absorb laser energy and mitigate flash point conditions.

FIG. 4 shows a flat pattern of a local boss feature 20 in which the area 24 already has deposited maskant on it and the spray stream 36 is depositing the strip 28. The heavy dash lines 20 and 21 represent the traces of the boundary scanning laser beams directed respectively from the right and left sides of the strip 28 shown in FIG. 4. The curvilinear edge of boss feature 20 will be followed by a correspondingly curvilinear laser scan. Traces 34 and 36 and traces 35 and 37 are respectively generated by beams directed from the right and left sides of the maskant strip 28. The crossing of the maskant strip path by the ray pencils of traces 34, 36, 35 and 37 in combination with ray pencils of traces 20 and 21 provides an substantially complete containment screen around the spray stream 33. This invention is that such a screen be generated to evaporate and/or disintegrate spurious material emitted by the maskant spray stream, and to direct the focused energy of this screen along and away from the perimeters of existing masked areas and along the edges of areas where new maskant is to be deposited aligned and trimmed.

FIG. 5 shows a cross section of a rib, 13, which has been produced by a single chemical milling operation on which a maskant strip 11 is being deposited by the maskant stream 30 and being aligned, trimmed and contained by the scanned laser fan beams 4 and 6. The same principles taught by this invention apply to the application of the first and second chemical milling cut maskants.

While certain specific components, procedures and arrangements have been detailed in the above description of the preferred embodiments of this invention, these may be varied and other components, procedures and arrangements used, where suitable, with similar results. Other applications and variations of the present invention will occur to those skilled in the art upon reading this disclosure. These are intended to be included within the scope of this invention, as defined in the appended claims. The present embodiments of the appended claims and all changes which come within the meaning and range of equivalency of the claims are therefore intended to be embraced by the claims.

I claim as my invention and desire to be protected by Letters Patent of the United States:

1. The method of applying maskant to selected areas of a workpiece which comprises the steps of:
   directing a stream of material capable of forming a maskant coating on a workpiece surface toward said surface in a selected pattern; and
   simultaneously scanning a laser beam along at least one edge of said selected pattern adjacent to said maskant stream to disintegrate maskant material extending beyond said edge of said selected pattern;
   whereby maskant material deposited on said workpiece surface beyond said edge and airborne maskant material drifting beyond said edge is disintegrated and a precise maskant edge results.

2. The method according to claim 1 wherein said pattern has two opposite edges and two laser beams are scanned along said opposite edges.

3. The method according to claim 1 further including directing a flow of ventilating gas past said workpiece surface during material deposition to carry away any products of maskant disintegration.

4. The method according to claim 3 wherein said gas is an inert gas.

5. The method according to claim 1 wherein said method is repeated at least one additional time with the same pattern to produce a thicker maskant coating.

6. The method according to claim 1 wherein said method is repeated at least one additional time with a different pattern and said laser scan is interrupted where the scan would cross a previously applied maskant coating.

7. The method according to claim 1 wherein said edge has straight and curvilinear regions and said laser scan follows corresponding straight and curvilinear paths.

8. The method according to claim 1 further including directing said laser beam scan across the surface to be coated in advance of maskant application whereby said surface is conditioned to enhance maskant adhesion to said surface.

9. The method according to claim 1 further including directing said laser beam scan along the edges of the maskant coating at energy levels less than that energy level for disintegrating said maskant material extending beyond said edge of said selected pattern to heat the maskant and enhance adhesion of the maskant to said surface.

10. The method according to claim 1 wherein a first maskant coating is applied while scanning a first edge with one laser beam, then applying a second maskant coating overlapping an unscanned edge of said first coating while scanning the non-overlapped edge of said second coating with a laser beam.

11. The method of applying maskant to selected areas of a workpiece which comprises the steps of:
    directing a stream of material capable of forming a maskant coating on a workpiece surface toward said surface in a selected linear pattern; and
    simultaneously scanning laser beams along both edges of said selected linear pattern adjacent to said maskant stream to disintegrate maskant material extending beyond said edge of said selected pattern; and
    directing a flow of inert gas past said surface during maskant material deposition to remove disintegration products;
    whereby maskant material deposited on said workpiece surface beyond said edge and airborne maskant material drifting beyond said edge is disintegrated and precise maskant edges result.

12. The method according to claim 11 wherein said method is repeated at least one additional time with the same pattern to produce a thicker maskant coating.

13. The method according to claim 11 wherein said method is repeated at least one additional time with a different pattern and said laser scan is interrupted where that scan would cross a previously applied maskant coating.

14. The method according to claim 11 wherein said at least one edge has straight and curvilinear regions and said laser scan follows corresponding straight and curvilinear paths.

15. The method according to claim 11 further including directing laser beam scan across the surface to be coated in advance of maskant application whereby said surface is conditioned to enhance maskant adhesion to said surface.

16. The method according to claim 11 further including directing said laser beam scan along the edges of the maskant coating at energy levels less than that energy level for disintegrating said maskant material extending beyond said edge of said selected pattern to heat the maskant and enhance adhesion of the maskant to said surface.

* * * * *